United States Patent
Cho et al.

(10) Patent No.: US 8,626,679 B2
(45) Date of Patent: *Jan. 7, 2014

(54) APPARATUS AND METHOD FOR ESTIMATING STATE OF CHARGE IN BATTERY USING FUZZY ALGORITHM IMPLEMENTED AS NEURAL NETWORK

(75) Inventors: Il Cho, Daejeon (KR); Do Youn Kim, Daejeon (KR); Do Yang Jung, Gyeonggi-do (KR)

(73) Assignee: LG Chem, Ltd., Seoul (KR)

( * ) Notice: Subject to any disclaimer, the term of this patent is extended or adjusted under 35 U.S.C. 154(b) by 430 days.

This patent is subject to a terminal disclaimer.

(21) Appl. No.: 12/869,242

(22) Filed: Aug. 26, 2010

(65) Prior Publication Data

US 2010/0324848 A1 Dec. 23, 2010

Related U.S. Application Data

(63) Continuation of application No. 11/452,007, filed on Jun. 13, 2006, now abandoned.

(30) Foreign Application Priority Data

Jun. 13, 2005 (KR) .................. 10-2005-0050273

(51) Int. Cl.
*G06F 15/18* (2006.01)
(52) U.S. Cl.
USPC ............. 706/12; 320/132; 324/426; 324/427; 324/429; 324/431; 702/63; 702/64; 702/193
(58) Field of Classification Search
USPC ............. 706/12; 320/132; 324/426, 427, 429, 324/431; 702/63, 64, 193
See application file for complete search history.

(56) References Cited

U.S. PATENT DOCUMENTS

| | | | |
|---|---|---|---|
| 5,714,866 | A | 2/1998 | S et al. |
| 6,011,379 | A | 1/2000 | Singh et al. |
| 6,064,180 | A | 5/2000 | Sullivan et al. |
| 6,534,954 | B1 | 3/2003 | Plett |
| 2001/0033169 | A1 | 10/2001 | Singh et al. |
| 2003/0184307 | A1 | 10/2003 | Kozlowski et al. |

(Continued)

FOREIGN PATENT DOCUMENTS

| JP | 06240318 A | 8/1994 |
|---|---|---|
| JP | 2003-168101 | 6/2003 |
| JP | 2004-333472 | 11/2004 |

OTHER PUBLICATIONS

"Battery state-of-charge (SOC) estimation using adaptive neuro-fuzzy inference system (ANFIS)", C.H. Cai, C.Y. Liu, Fuzzy Systems, 2003, the 12th IEEE International Conference on May 25-28, 2003, vol. 2, pp. 1068-1073.

(Continued)

*Primary Examiner* — Kakali Chaki
*Assistant Examiner* — Mai T Tran
(74) *Attorney, Agent, or Firm* — Birch, Stewart, Kolasch & Birch, LLP

(57) ABSTRACT

Disclosed is an apparatus and method for estimating a state of charge (SOC) in a battery, the apparatus including a detector unit; a soft computing unit for calculating and outputting a battery SOC estimation value by processing a current, a voltage and a temperature detected by the detector unit using a computing algorithm, which is a fuzzy algorithm implemented as a neural network, the soft computing unit storing the battery SOC estimation value in a memory, where the fuzzy algorithm has a form expressed as $F=\Phi(P,X)W$, where $\Phi$ is one of a fuzzy radial function, a radial basis function, and an activation function in the neural network, P is a learning parameter, X is an input, and W is a weight to be updated during learning.

6 Claims, 2 Drawing Sheets

(56) References Cited

U.S. PATENT DOCUMENTS

2004/0253489 A1 12/2004 Horgan et al.
2005/0194936 A1 9/2005 Cho

OTHER PUBLICATIONS

"Capacity and Battery Ratings", by Engineers Edge, 2000, 1 page. http://www.engineersedge.com/battery/capacity_battery_ratings.htm.

"Methods for state-of-charge determination and their applications", Sabine Piler, Marion Perrin and Andreas Jossen, Journal of Power Sources, vol. 96, Issue 1, Jun. 1, 2001, Proceedings of the 22nd International Power Sources Symposium, pp. 113-120.

"Soft computing and fuzzy logic", L.A. Zadeh, Software, IEEE Nov. 1994, vol. 11, Issue 6, pp. 48-56.

Soft-Computing—Concepts & Applications—Section 3; "The roles of fuzzy logic and soft computing in the conception, design and deployment of intelligent systems", L.A. Zadeh, Lecture Notes in Computer Science, vol. 1198, pp. 181-190.

APPARATUS AND METHOD FOR ESTIMATING STATE OF CHARGE IN BATTERY USING FUZZY ALGORITHM IMPLEMENTED AS NEURAL NETWORK

CROSS-REFERENCE TO RELATED APPLICATIONS

This application is a continuation of pending U.S. patent application Ser. No. 11/452,007, filed on Jun. 13, 2006, which claims the benefit of the filing date of Korean Patent Application No. 10-2005-50273, filed on Jun. 13, 2005, in the Korean Intellectual Property Office, the contents of which are incorporated herein by reference in its entirety.

BACKGROUND OF THE INVENTION

1. Field of Invention

The present invention relates to an apparatus and method for estimating a state of charge (SOC) in a battery, and more particularly to an apparatus and method for estimating an SOC in a battery, using fusion type soft computing.

2. Description of Related Art

In general, a state of charge (SOC) in a battery has a nonlinear characteristic. Hence, it is difficult to accurately detect the battery SOC in practice. As a result, the detection of the battery SOC depends on its estimation method.

Examples of a conventional estimation method of the battery SOC include an amp-hour (Ah) counting method, an open circuit voltage (OCV) measuring method, a battery impedance measuring method, and so on.

The Ah counting method is for detecting the SOC by detecting a real capacity of the battery. However, the Ah counting method is greatly influenced by errors or precision of sensors detecting the real capacity, thereby having a great error.

The OCV measuring method is for reading out open voltage of the battery in an idle state, and estimating an SOC from the read open voltage. This method has problems in that it can be used only in the idle state, and it is greatly influenced by external factors such as temperature.

The battery impedance measuring method is for estimating an SOC of the battery from an impedance measurement value of the battery. This method has a problem in that the precision of an estimation value is lowered because it is greatly influenced by temperature.

Mobile phones, laptop computers etc. used in a low C-rate environment do not require accurate detection of the battery SOC in view of their characteristics. In these products, the battery SOC is readily estimated by the Ah counting method, the OCV measuring method, or so on. Here, the term C-rate refers to magnitude of the peak current that can be output in a moment.

However, in the case of hybrid electrical vehicles (HEVs), electrical vehicles (EVs) etc. used in a high C-rate environment, accurate information on the battery SOC is required like the fuel gauge of an ordinary vehicle, while a degree of non-linearity of the battery SOC is enhanced. Hence, the conventional methods for estimating the battery SOC have difficulty in estimating the battery SOC in these products.

BRIEF SUMMARY OF THE INVENTION

It is an objective of the present invention to provide an apparatus and method for estimating a state of charge (SOC) in a battery, in which the battery SOC is estimated using a fusion type soft computing algorithm, thereby accurately estimating the battery SOC in a high C-rate environment.

According to an aspect of the present invention, there is provided an apparatus for estimating a state of charge (SOC) in a battery. The apparatus includes a detector unit including a current detector for detecting current from a battery cell, a voltage detector for detecting voltage from the battery cell, and a temperature detector for detecting temperature from the battery cell; a soft computing unit for calculating and outputting a battery SOC estimation value by processing the current, the voltage and the temperature detected by the detector unit using a computing algorithm, which is a fuzzy algorithm implemented as a neural network, the soft computing unit storing the battery SOC estimation value in a memory; and a comparator operably coupled to the soft computing unit and a charger-discharger, discharger being further operably coupled to the battery cell, the comparator comparing the battery SOC estimation value with a predetermined target value that varies with charging or discharging of the battery, the comparator further providing an algorithm update signal to the soft computing unit to update the computing algorithm based on a learning algorithm when a difference between the battery SOC estimation value and the predetermined target value is outside of a critical range, wherein the fuzzy algorithm has a form expressed as $F=\Phi(P,X)W$, where $\Phi$ is one of a fuzzy radial function, a radial basis function, and an activation function in the neural network, P is a learning parameter, X is an input, and W is a weight to be updated during learning.

Further, the soft computing unit may combine the neural network algorithm with any one of a fuzzy algorithm, a genetic algorithm (GA), a cellular automata (CA) algorithm, an immune system algorithm, and a rough-set algorithm, and thereby adaptively update the parameters of the neural network algorithm.

DETAILED DESCRIPTION OF THE INVENTION

Reference will now be made in detail to the exemplary embodiments of the present invention.

Figure 1:
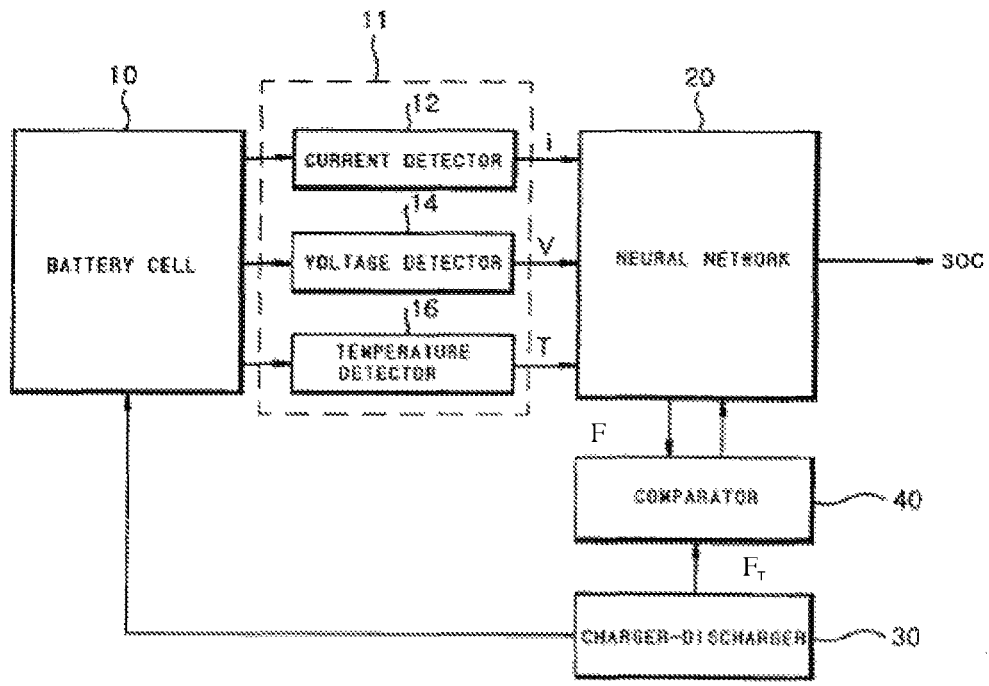
FIG. 1 is a block diagram of an apparatus for estimating a state of charge (SOC) in a battery in accordance with an embodiment of the present invention.

FIG. 1 is a block diagram of an apparatus for estimating a state of charge (SOC) in a battery in accordance with an embodiment of the present invention. Referring to FIG. 1, the SOC estimation apparatus is comprised of a battery cell 10, a detector unit 11, a soft computing unit 20, a charger-discharger 30, and a comparator 40.

The detector unit 11 includes a current detector 12, a voltage detector 14, and a temperature detector 16. The current detector 12 detects current i from the battery cell 10 at a point of time k. The voltage detector 14 detects voltage v from the battery cell 10 at a point of time k. The temperature detector 16 detects temperature T from the battery cell 10 at a point of time k.

Soft computing is generically called a function approximator made by engineeringly modeling brain information transfer, reasoning, learning, genetic, and immune systems of a living thing, and is widely used in control and identification fields throughout the industry. Here, the identification refers to capturing input/output characteristics of a system.

A soft computing algorithm is an algorithm capable of performing identification and control of a specific system while self-organizing parameters only with input/output information although accurate information and model are not known.

However, the problem is that soft computing techniques each involve different drawbacks. In other words, the battery SOC estimation using any soft computing technique is relatively accurate only in a specific environment, but not in another environment.

In order to solve the above-mentioned problem and to make an approximation of function more accurate, the soft computing unit 20 estimates the battery SOC, using the fusion type soft computing.

A fusion type soft computing algorithm of which the soft computing unit 20 makes use is an algorithm in which a plurality of algorithms that can be self-organized by performing adaptive parameter update are mutually combined in a fusion type, and is subjected to bio-motive. Here, the bio-motive refers to use after the model of biological information literacy.

More specifically, the fusion type soft computing algorithm of which the soft computing unit 20 makes use is an algorithm combining a neural network algorithm with any one of a fuzzy algorithm, a genetic algorithm (GA), a cellular automata (CA) algorithm, an immune system algorithm, and a rough-set algorithm. The immune system algorithm is a modeling method in which an identification or control point, and disturbance are set as an antibody and an antigen respectively, and thereby any desired point can be estimated even when any disturbance is added. The CA algorithm is a method of modeling a complicated algorithm in a binary type string. The rough-set algorithm is a method of modeling and applying correlation of parameters in a numerical formula.

A neuro-fuzzy algorithm combining the neural network algorithm to the fuzzy algorithm is a type of automatically adjusting parameters by implementing a fuzzy reasoning system using a neural network.

The neuro-fuzzy algorithm can automatically create the expert rule base of a fuzzy theory by execution of a learning algorithm.

Generally, persons who are well aware of a certain system perform a work using fuzzy information rather than accurate information. For example, a skilled welder who is well aware of a welding system performs the welding well using fuzzy information, for instance, that the welding is well done when a welding temperature should be slightly increased at about this position.

Creating the expert rule base of a fuzzy theory refers to a process of obtaining a rule composed of an IF-THEN statement from experts on a certain system in this manner.

In general, it is the most difficult work that obtains the rule base in the fuzzy algorithm. Meanwhile, the neuro-fuzzy algorithm has an advantage in that this rule base can be automatically created by using learning capability of the neural network.

Further, in view of the neural network, a size of the neural network (i.e. a neuron number), selection of an activation function, etc. have a great influence on entire performance. When the fuzzy theory is used in this field, the performance of the neural network can be optimized. To be specific, by setting the neural network size to the number of rule bases, and using any one of fuzzy functions as the activation function, the performance of the neural network can be optimized.

In the neuro-fuzzy algorithm, the neural network models hardware embodiment of a brain, and the fuzzy concept models human thinking.

A neuro-GA algorithm combining the neural network algorithm to the GA is an algorithm for performing identification of various parameters required for learning by implementing a learning algorithm of the neural network using the GA.

In addition to these algorithms, the soft computing unit 20 may make use of a neuro-CA algorithm combining the neural network algorithm to the CA algorithm, a neuro-rough set algorithm combining the neural network algorithm to the rough set algorithm, and so on.

In the present embodiment, the soft computing unit 20 estimates the battery SOC using the neuro-fuzzy algorithm, wherein the neuro-fuzzy algorithm is merely illustrative of the fusion type soft computing algorithm. The soft computing unit 20 may estimate the battery SOC using a fusion type soft computing algorithm other than the neuro-fuzzy algorithm.

The soft computing unit 20 performs the neuro-fuzzy algorithm based on current i, voltage v, and temperature T detected by the detector unit 11, and a detecting time k, and outputs an estimation value F of the battery SOC.

When receiving an algorithm update signal from the comparator 40, the soft computing unit 20 performs a learning algorithm on the neuro-fuzzy algorithm, thereby updating the fusion type soft computing algorithm.

When the fusion type soft computing algorithm is updated, the soft computing unit 20 performs the updated fusion type soft computing algorithm, and outputs an updated estimation value F of the battery SOC.

When the soft computing algorithm is updated, the soft computing unit 20 performs the updated soft computing algorithm, and outputs an updated estimation value F of the battery SOC.

The charger-discharger 30 supplies the battery cell 10 with charge/discharge current.

The comparator 40 compares the estimation value F output by the soft computing unit 20 with a predetermined target value $F_T$. When a difference between the output estimation value F and the target value $F_T$ is beyond a critical range, the comparator 40 outputs the algorithm update signal to the soft computing unit 20.

Ideally, the target value $F_T$ is a value of the real "genuine" battery SOC. However, because it is difficult to find the value, a reference value obtained through a proper test under a specific condition is used.

For example, the target value $F_T$ may be a value that complements an amp-hour (Ah) counting value and an open circuit voltage (OCV) value, which are input from the charger-discharger, to rated capacity of the battery.

Figure 2:
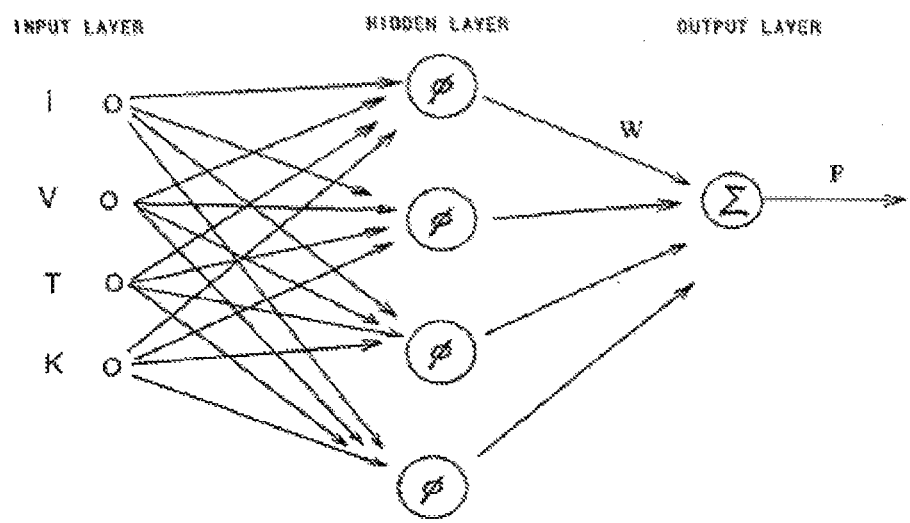
FIG. 2 illustrates a construction of a fuzzy neural network in the soft computing unit of FIG. 1.

FIG. 2 illustrates a construction of a fuzzy neural network in the soft computing unit 20 of FIG. 1. Referring to FIG. 2, the fuzzy neural network is generally composed of an input layer, a hidden layer, and an output layer.

If the number of basis functions is the same as the number of fuzzy control rules, if the consequent of a fuzzy rule is a constant, if an operator of the network is equal to a function of the output layer, and if a membership function in the fuzzy rule is the basis function of the same width (dispersion), a fuzzy system is equivalent to a radial basis function network of FIG. 2. Here, the radial basis function network is a concrete name of the neural network, and is a kind of neural network.

The soft computing unit 20 executes the neuro-fuzzy algorithm according to a structure of the fuzzy neural network. The neuro-fuzzy algorithm is no other than the battery SOC estimation algorithm. Final output for applying the battery SOC estimation algorithm according to the fuzzy neural network in the soft computing unit 20 has a form as expressed by Equation 1 below.

$$F = \Phi(P, X)W \qquad \text{Equation 1}$$

where $\Phi$ is the fuzzy radial function, or the radial basis function or the activation function in the neural network, P is the parameter, X is the input, W is the weight to be updated during learning.

Now, the following is to apply Equation 1 to the structure of the fuzzy neural network of FIG. 2.

In FIG. 2, $X = x_d(k)$ is an input data vector input into the structure of the fuzzy neural network. In the present embodiment, $x_d(k) = (i, v, T, k)$. Here, i, v, and T are current, voltage, and temperature data, which are detected from the battery cell 10 at a point of time k by the detector unit 11 of FIG. 1.

In Equation 1, F, i.e. the final output is the product of the radial function, $\Phi = \emptyset d(k)$, and $W = wd(k)$.

Here, W is the coefficient denoting the connection strength (weight). W is updated at every point of time k by a back propagation (BP) learning algorithm to be described below. Thus, the function is approximated to perform identification of a non-linear function.

As a result of the comparator 40 of FIG. 1 comparing the output value F of the fuzzy neural network and the target value $F_T$, when an error between the output value F and the target value $F_T$ is beyond a critical range (e.g., 3%), the comparator 40 of FIG. 1 outputs the algorithm update signal to the soft computing unit 20 of FIG. 1.

When the soft computing unit 20 of FIG. 1 receives the algorithm update signal, the learning algorithm is executed in the fuzzy neural network of FIG. 2. In the present embodiment, the learning algorithm will be described focused on the BP learning algorithm, but it is merely illustrative. For example, the learning algorithm may include a Kalman filter, the genetic algorithm, a fuzzy learning algorithm, or so on.

As for the BP learning algorithm, first, an error function is defined as follows.

$$E = \frac{1}{2}(F_T(k) - F(k)) \qquad \text{Equation 2}$$

where FT(k) is the desired output, i.e. the target value, and F(k) is the real output of the fuzzy neural network. Thus, final weight update is expressed by Equation 3 below.

$$W(t+1) = W(t) + \eta\left(-\frac{\partial E}{\partial W}\right) \qquad \text{Equation 3}$$

where $\eta$ is the learning rate.

In this manner, the neuro-fuzzy algorithm is updated by repetitively executing the BP learning algorithm. More specifically, a W value of the neuro-fuzzy algorithm is updated by repetitively executing the BP learning algorithm.

The fuzzy neural network outputs a new output value F determined by the updated W value to the comparator 40 again. This process is repeated until the error between the output value F and the target value $F_T$ of the fuzzy neural network falls within a predetermined range.

When the error between the output value F of the fuzzy neural network and the target value $F_T$ of the fuzzy neural network does not deviate from the predetermined range, the comparator 40 of FIG. 1 does not transmit the algorithm update signal. Thereby, the execution of the learning algorithm on the fuzzy neural network is terminated. An estimation value of the battery SOC is output using the final neuro-fuzzy algorithm formula (i.e. Equation 1) obtained by the execution of the learning algorithm.

Figure 3:
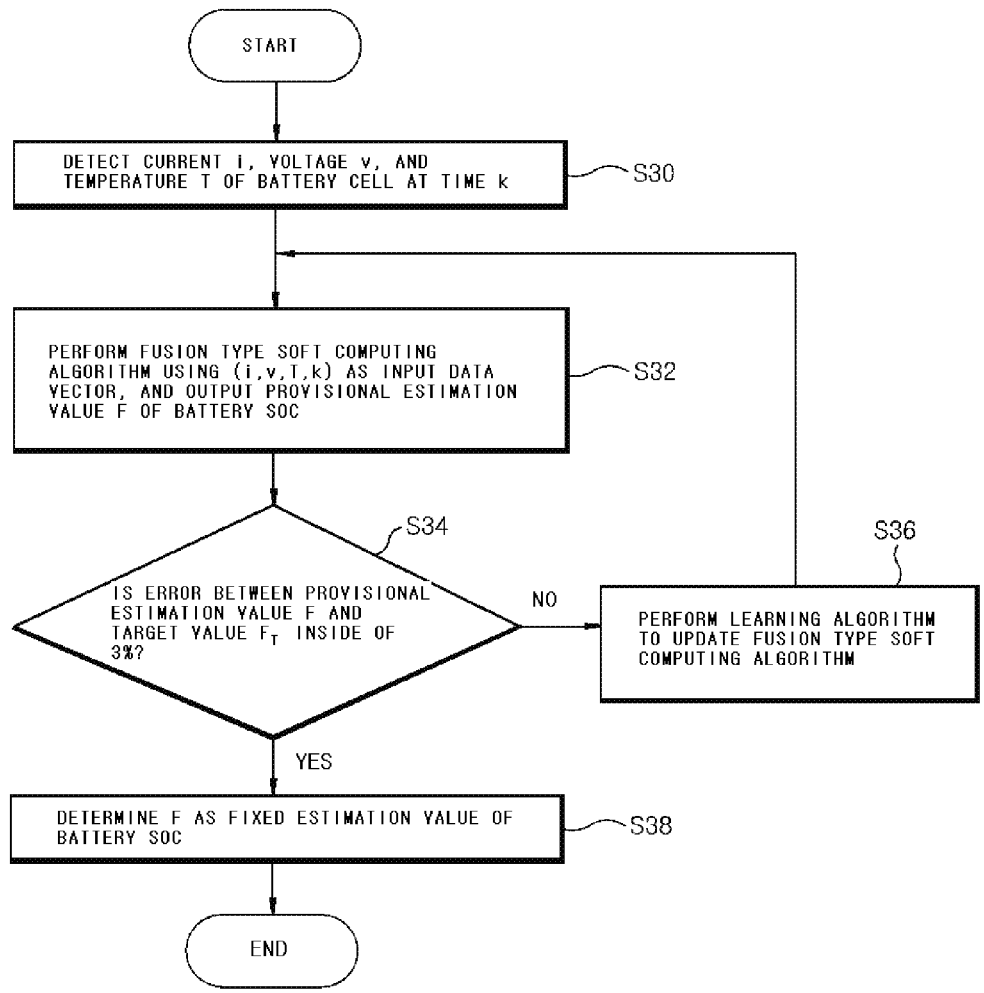
FIG. 3 is a flowchart of a method for estimating an SOC in a battery in accordance with an embodiment of the present invention.

FIG. 3 is a flowchart of a method for estimating an SOC in a battery in accordance with an embodiment of the present invention. Referring to FIG. 3, the detector unit 11 detects current i, voltage v, and temperature T from the battery cell 10 at a point of time k (S30).

The soft computing unit 20 performs the neuro-fuzzy algorithm using data of the current i, voltage v, and temperature T detected by the detector unit 11 and data of the time k, as input data vectors, thereby outputting a provisional estimation value F (S32). In other words, the soft computing unit 20 performs the neuro-fuzzy algorithm using $x_d(k) = (i, v, T, k)$, thereby outputting a provisional estimation value F.

The comparator 40 compares the provisional estimation value F with a target value $F_T$, and checks whether or not the compared error is inside of 3% (S34). In the present embodiment, a critical range of the error is set to within 3%, but it is merely illustrative. Accordingly, the critical range of the error may be sufficiently varied by a designer. A final estimation value of the battery SOC becomes higher as the critical range of the error becomes narrower, and it becomes lower as the critical range of the error becomes wider.

When the error between the provisional estimation value F and the target value $F_T$ is outside of 3%, the soft computing unit 20 performs the above-mentioned learning algorithm on the neuro-fuzzy algorithm, thereby updating the neuro-fuzzy algorithm (S36). Then, the soft computing unit 20 performs the updated fusion type soft computing algorithm to calculate an updated provisional estimation value F of the battery SOC (S32).

The comparator 40 compares the updated provisional estimation value F with a target value $F_T$, and checks whether or not the compared error is inside of 3% (S34). When the error between the provisional estimation value F and the target value $F_T$ is outside of 3%, the soft computing unit 20 performs the learning algorithm on the neuro-fuzzy algorithm again (S36), and performs the updated neuro-fuzzy algorithm (S32).

In other words, the soft computing unit 20 performs the learning algorithm and the updated neuro-fuzzy algorithm repetitively, until the error between the provisional estimation value F and the target value FT gets inside of 3%.

When the error between the provisional estimation value F and the target value $F_T$ is inside of 3%, the soft computing unit 20 does not perform the learning algorithm. As a result, a final neuro-fuzzy algorithm formula (e.g. Equation 3) is obtained.

The provisional estimation value F calculated by the final neuro-fuzzy algorithm formula is determined as a fixed estimation value F of the battery SOC (S38).

The present invention can implement a computer-readable recording medium as a computer-readable code. The computer-readable recording medium includes all types of recording media in which computer-readable data is stored. Examples of the computer-readable recording media include a read only memory (ROM), a random access memory (RAM), a compact disk (CD)-ROM, a magnetic tape, a floppy disk, an optical data storage device, and so on, and furthermore what is embodied in the type of a carrier wave (e.g. transmitted through Internet). Further, the computer-readable recording media are distributed on a computer system connected through a network, and allow the code that can be read by the computer in a distributed way to be stored and executed.

INDUSTRIAL APPLICABILITY

As can be seen from the foregoing, according to the present invention, the battery SOC can be dynamically estimated through the fusion type soft computing algorithm and the learning algorithm. Further, the battery SOC can be more accurately estimated using at least data according to the various environments such as temperature, C-rate, and so on.

Thus, according to the present invention, the battery SOC can be accurately estimated in the high C-rate environment. Because the fusion type soft computing algorithm is used for estimating the battery SOC, it is possible to overcome a drawback that each single soft computing algorithm is relatively accurate only in a specific environment and is lowered in precision in another environment.

Especially, when the neuro-fuzzy algorithm is used as the fusion type soft computing algorithm, the fuzzy logic is implemented as the neural network. Thereby, it is possible to automatically create the fuzzy rules through learning. Due to this possibility, it is possible to exert excellent performance in connection with initial weight setting stability and system convergence, compared to the existing single neuro-fuzzy algorithm.

The present invention can be more broadly utilized in a field in which the estimation of the battery SOC requires higher precision as in the field of hybrid electrical vehicles. Thus, the present invention can be applied to a lithium ion polymer battery (LiPB) for the hybrid electrical vehicle, as well as other batteries.

While this invention has been described in connection with what is presently considered to be the most practical and exemplary embodiment, it is to be understood that the invention is not limited to the disclosed embodiment and the drawings, but, on the contrary, it is intended to cover various modifications and variations within the spirit and scope of the appended claims.

We claim:

1. An apparatus for estimating a state of charge (SOC) in a battery, the apparatus comprising:
    a detector unit including a current detector for detecting current from a battery cell, a voltage detector for detecting voltage from the battery cell, and a temperature detector for detecting temperature from the battery cell;
    a soft computing unit for calculating and outputting a battery SOC estimation value by processing the current, the voltage and the temperature detected by the detector unit using a computing algorithm, which is a fuzzy algorithm implemented as a neural network, the soft computing unit storing the battery SOC estimation value in a memory; and
    a comparator operably coupled to the soft computing unit and a charger-discharger, the charger-discharger being further operably coupled to the battery cell, the comparator comparing the battery SOC estimation value with a predetermined target value that varies with charging or discharging of the battery, the comparator further providing an algorithm update signal to the soft computing unit to update the computing algorithm based on a learning algorithm when a difference between the battery SOC estimation value and the predetermined target value is outside of a critical range,
    wherein the fuzzy algorithm has a form expressed as $F=\Phi(P,X)W$, where $\Phi$ is one of a fuzzy radial function, a radial basis function, and an activation function in the neural network, P is a learning parameter, X is an input, and W is a weight to be updated during learning.

2. The apparatus according to claim 1, wherein the predetermined target value is a reference value obtained through a corresponding test on a specific condition.

3. The apparatus according to claim 1, wherein the learning algorithm is any one of a back propagation learning algorithm, a Kalman filter, a genetic algorithm, and a fuzzy learning algorithm.

4. A method for estimating a state of charge (SOC) in a battery, the method comprising the steps of:
    detecting current, voltage and temperature from a battery cell, utilizing a current detector, a voltage detector, and a temperature detector, respectively;
    calculating a battery SOC estimation value by processing the detected current, voltage and temperature using a computing algorithm, which is a fuzzy algorithm implemented as a neural network, utilizing a soft computing unit;
    storing the battery SOC estimation value in a memory utilizing the soft computing unit;
    calculating a difference value between the calculated battery SOC estimation value and a predetermined target value varying with charging or discharging of the battery utilizing a comparator operably coupled to the soft computing unit and a charger-discharger;
    sending an algorithm update signal from the comparator to the soft computing unit when a difference between the battery SOC estimation value and the predetermined target value is outside of a critical range; and
    updating the computing algorithm based on a learning algorithm utilizing the soft computing unit in response to the algorithm update signal,
    wherein the fuzzy algorithm has a form expressed as $F=\Phi(P,X)W$, where $\Phi$ is one of a fuzzy radial function, a radial basis function, and an activation function in the neural network, P is a learning parameter, X is an input, and W is a weight to be updated during learning.

5. The method according to claim 4, wherein the predetermined target value is a reference value obtained through a corresponding test on a specific condition.

6. The method according to claim 4, wherein the learning algorithm is any one of a back propagation learning algorithm, a Kalman filter, a genetic algorithm, and a fuzzy learning algorithm.

* * * * *